(12) United States Patent
Hill

(10) Patent No.: US 12,101,076 B2
(45) Date of Patent: Sep. 24, 2024

(54) ALUMINUM NITRIDE DOPANT SCHEME FOR BULK ACOUSTIC WAVE FILTERS

(71) Applicant: SKYWORKS SOLUTIONS, INC., Irvine, CA (US)

(72) Inventor: Michael David Hill, Emmitsburg, MD (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 717 days.

(21) Appl. No.: 17/186,218

(22) Filed: Feb. 26, 2021

(65) Prior Publication Data

US 2021/0273625 A1    Sep. 2, 2021

Related U.S. Application Data

(60) Provisional application No. 62/983,152, filed on Feb. 28, 2020.

(51) Int. Cl.
H03H 3/02 (2006.01)
H03H 9/00 (2006.01)
H03H 9/02 (2006.01)
H03H 9/17 (2006.01)
H03H 9/56 (2006.01)
(Continued)

(52) U.S. Cl.
CPC .......... *H03H 9/02031* (2013.01); *H03H 3/02* (2013.01); *H03H 9/0014* (2013.01); *H03H 9/02228* (2013.01); *H03H 9/173* (2013.01); *H03H 9/175* (2013.01); *H03H 9/176* (2013.01); *H03H 9/562* (2013.01); *H03H 9/564* (2013.01); *H03H 9/568* (2013.01); *H03H 9/706* (2013.01); *H03H 2003/021* (2013.01); *H03H 2003/025* (2013.01); *H04B 1/40* (2013.01)

(58) Field of Classification Search
CPC .... H03H 9/02031; H03H 3/02; H03H 9/0014; H03H 9/02228; H03H 9/173; H03H 9/175; H03H 9/176; H03H 9/562; H03H 9/564; H03H 2003/021; H03H 2003/025; Y10T 29/42; Y10T 29/49005
See application file for complete search history.

(56) References Cited

U.S. PATENT DOCUMENTS

| 4,952,535 A | 8/1990 | Merkel |
| 5,637,541 A | 6/1997 | Kuszyk et al. |
| 7,682,709 B1 | 3/2010 | Davis et al. |

(Continued)

FOREIGN PATENT DOCUMENTS

| CN | 1541447 A | 10/2004 |
| EP | 2246458 A1 | 11/2010 |

(Continued)

OTHER PUBLICATIONS

Felmetsger et al., "Reactive Magnetron Sputtering of Piezoelectric Cr-Doped A1N Thin Films", Ultrasonics Symposium (IUS), 2011 IEEE International, Oct. 18-21, 2011.

(Continued)

*Primary Examiner* — Donghai D Nguyen
(74) *Attorney, Agent, or Firm* — Lando & Anastasi, LLP

(57) ABSTRACT

Disclosed is an acoustic wave resonator comprising a substrate material formed of aluminum nitride (AlN) doped with one or more of beryllium (Be), strontium (Sr), and sodium (Na) to enhance performance of the acoustic wave resonator.

15 Claims, 15 Drawing Sheets

| End Member | End Member Crystal Structure | Solid Solution Series |
|---|---|---|
| ScN | Halite | $Al_{1-x}Sc_xN$ |
| $BeSiN_2$ | Wurtzite | $Al_{1-2x}Be_xSi_xN$ |
| $MgSiN_2$ | Wurtzite | $Al_{1-2x}Mg_xSi_xN$ |
| $MnSiN_2$ | Wurtzite | $Al_{1-2x}Mn_xSi_xN$ |
| $ZnSiN_2$ | Wurtzite | $Al_{1-2x}Zn_xSi_xN$ |
| $CaAlSiN_3$ | Distorted Wurtzite | $Al_{1-2x}Ca_xSi_xN$ |
| $SrAlSiN_3$ | Distorted Wurtzite | $Al_{1-2x}Sr_xSi_xN$ |
| $LiSi_2N_3$ | Distorted Wurtzite | $Al_{1-3x}Li_xSi_{2x}N$ |
| $NaSi_2N_3$ | Distorted Wurtzite | $Al_{1-3x}Na_xSi_{2x}N$ |
| $NaGe_2N_3$ | Distorted Wurtzite | $Al_{1-3x}Na_xGe_{2x}N$ |

(51) Int. Cl.
*H03H 9/70* (2006.01)
*H04B 1/40* (2015.01)

(56) References Cited

U.S. PATENT DOCUMENTS

| | | |
|---|---|---|
| 7,758,979 B2 | 7/2010 | Akiyama et al. |
| 8,841,819 B2 | 9/2014 | Nishihara et al. |
| 9,071,225 B2 | 6/2015 | Nishihara et al. |
| 9,088,265 B2 | 7/2015 | Bradley et al. |
| 9,136,819 B2 | 9/2015 | Grannen et al. |
| 9,154,111 B2 | 10/2015 | Bradley et al. |
| 9,225,313 B2 | 12/2015 | Bradley et al. |
| 9,246,461 B2 | 1/2016 | Akiyama et al. |
| 9,455,681 B2 | 9/2016 | Feng et al. |
| 9,520,855 B2 | 12/2016 | Feng et al. |
| 9,577,603 B2 | 2/2017 | Burak et al. |
| 9,590,165 B2 | 3/2017 | Zou et al. |
| 9,602,073 B2 | 3/2017 | Grannen et al. |
| 10,505,514 B2 * | 12/2019 | Inoue .............. H03H 9/205 |
| 11,031,540 B2 | 6/2021 | Hill et al. |
| 11,646,714 B2 * | 5/2023 | Segovia Fernandez .................... H03B 5/364 333/187 |
| 2003/0178633 A1 | 9/2003 | Flynn et al. |
| 2004/0189423 A1 | 9/2004 | Loebl et al. |
| 2006/0183625 A1 | 8/2006 | Miyahara |
| 2007/0284971 A1 | 12/2007 | Sano et al. |
| 2008/0075976 A1 | 3/2008 | Yamamoto et al. |
| 2013/0049544 A1 | 2/2013 | Yokoyama |
| 2013/0241673 A1 | 9/2013 | Yokoyama et al. |
| 2014/0125203 A1 | 5/2014 | Choy et al. |
| 2014/0125432 A1 | 5/2014 | Stephanou et al. |
| 2014/0167560 A1 | 6/2014 | Onda |
| 2014/0292150 A1 | 10/2014 | Zou et al. |
| 2015/0326200 A1 | 11/2015 | Grannen et al. |
| 2015/0333248 A1 | 11/2015 | Moulard |
| 2015/0357987 A1 | 12/2015 | Shealy |
| 2016/0156332 A1 | 6/2016 | Umeda |
| 2017/0077386 A1 | 3/2017 | Shealy |
| 2017/0104465 A1 | 4/2017 | Burgess et al. |
| 2017/0294894 A1 | 10/2017 | Aida et al. |
| 2018/0342999 A1 | 11/2018 | Gibb et al. |
| 2019/0013458 A1 | 1/2019 | Hill et al. |
| 2019/0158057 A1 | 5/2019 | Jeong et al. |
| 2019/0238996 A1 | 8/2019 | Umeda et al. |
| 2021/0280771 A1 | 9/2021 | Hill et al. |
| 2022/0286108 A1 | 9/2022 | Hill |

FOREIGN PATENT DOCUMENTS

| | | |
|---|---|---|
| EP | 3153603 A1 | 4/2017 |
| EP | 3633082 A1 | 4/2020 |
| GB | 2277405 A | 10/1994 |
| JP | H01298071 A | 12/1989 |
| JP | H07508966 A | 10/1995 |
| JP | 2013219743 A | 10/2013 |
| JP | 2014121025 A | 6/2014 |
| JP | 2016504870 A | 2/2016 |
| JP | 2017045749 A | 3/2017 |
| JP | 2017095797 A | 6/2017 |
| JP | 2020526471 A | 8/2020 |
| KR | 10-2018-0102971 A | 9/2018 |
| WO | 2004005216 A1 | 1/2004 |
| WO | 20130141484 A1 | 9/2013 |
| WO | 2015025716 A1 | 2/2015 |
| WO | 2016111280 A1 | 7/2016 |
| WO | 2017094520 A1 | 6/2017 |
| WO | 2019235080 A1 | 12/2019 |

OTHER PUBLICATIONS

Borra et al., "Piezoelectric and Electroacoustic Properties of V-Doped and Ta-Doped Al N Thin Films", 2013 Joint U FFC, EFTF and PFM Symposium (Year: 2013).

Kabulski et al., "Erbium Alloyed Aluminum Nitride Films for Piezoelectric Applications", Materials Research Society, vol. 1129, Jan. 2008, 1129-V09-02 (published online Feb. 1, 2011).

Kano et al., "Enhancement of Piezoelectric Response in Scandium Aluminum Nitride Alloy Thin Films prepared by Dual Reactive Co-Sputtering", Advanced Materials, vol. 17, 2012, pp. 202-207.

Luo et al., "Influence of Cr-doping on microstructure and piezoelectric response of AlN films", Journal of Physics D: Applied Physics, vol. 42, 235406 (2009), 6 pages.

Tasnadi et al., "Significant configurational dependence of the electromechanical coupling constant of $B_{0.125}Al_{0.875}N$", Applied Physics Letters, vol. 94, 151911 (2009).

Search Report from corresponding United Kingdom Application No. 2102714.9 dated Aug. 17, 2021.

* cited by examiner

| End Member | End Member Crystal Structure | Solid Solution Series |
|---|---|---|
| ScN | Halite | $Al_{1-x}Sc_xN$ |
| BeSiN$_2$ | Wurtzite | $Al_{1-2x}Be_xSi_xN$ |
| MgSiN$_2$ | Wurtzite | $Al_{1-2x}Mg_xSi_xN$ |
| MnSiN$_2$ | Wurtzite | $Al_{1-2x}Mn_xSi_xN$ |
| ZnSiN$_2$ | Wurtzite | $Al_{1-2x}Zn_xSi_xN$ |
| CaAlSiN$_3$ | Distorted Wurtzite | $Al_{1-2x}Ca_xSi_xN$ |
| SrAlSiN$_3$ | Distorted Wurtzite | $Al_{1-2x}Sr_xSi_xN$ |
| LiSi$_2$N$_3$ | Distorted Wurtzite | $Al_{1-3x}Li_xSi_{2x}N$ |
| NaSi$_2$N$_3$ | Distorted Wurtzite | $Al_{1-3x}Na_xSi_{2x}N$ |
| NaGe$_2$N$_3$ | Distorted Wurtzite | $Al_{1-3x}Na_xGe_{2x}N$ |

FIG. 4

| | Space group | Lattice constants [pm] | Structure type | Silicate group |
|---|---|---|---|---|
| CaSiN$_2$ | Pbca | a=513.0, b=1022.4, c=1481.9 | filled Cristobalite | Tecto- |
| Ca$_5$Si$_2$N$_6$ | C2/c | a=983.6, b=605.2, c=1275.7, β=100.2° | homotypic to Ba$_5$Si$_2$N$_6$ | Oligo- (Di-) |
| Ca$_5$Si$_{2-x}$Al$_x$O$_x$N$_{8-x}$ (0 ≤ x ≤ 0.5) | P2$_1$/c | a=591.3, b=2034, c=951.8, β=105.61° | own | Phyllo- (Mono-) |
| Ca$_5$NbSi$_2$N$_9$ | P2$_1$/m | a=605.1, b=994.6, c=899.7, β=92.10° | own | Oligo- (Tri-) |
| Ce$_{3-x}$Ca$_{1.5+x}$Si$_{6-x}$Al$_x$O$_{x+1}$N$_{9-x}$ (0 ≤ x ≤ 9) | Pa$\bar{3}$ | a=1514.6 | own | Cyclo- (Hexa-) |
| CaSiAlN$_3$ | Cmc2$_1$ | a=985.1, b=565.4, c=507.1 | filled Wurtzite | Tecto- |
| Ca$_2$Si$_3$Al$_3$N$_9$ | Pbcn | a=925.5, b=614.0, c=1557.8 | own | Tecto- |
| Ca$_2$SiAlN$_7$ | P$\bar{1}$ | a=585.7, α=77.97°, b=815.9, β=77.07°, c=1305, γ=82.18° | own | Tecto- |
| Ca$_{15}$Si$_{20}$Al$_5$O$_{2.5}$N$_{35}$ | Pa$\bar{3}$ | a=1548.0 | own | Tecto- |

*FIG. 5A*

| | Space group | Lattice constants [pm] | Structure type |
|---|---|---|---|
| $Ca_2Si_5N_8$ | $Cc$ | a=1435.2, b=561.0 c=968.9, $\beta$ = 112.06° | $Ca_2Si_5N_8$ |
| $M_2Si_5N_8$ (M=Sr,Ba,Eu) | $Pmn2_1$ | a=571.0, b=682.2 c=934.1 (M=Sr) | $Sr_2Si_5N_8$ |
| $BaSi_7N_{10}$ | $Pc$ | a=678.3, b=671.3 c=963.3, $\beta$ = 106.27° | $BaSi_7N_{10}$ |
| $Ba_5Si_2N_6$ | $P2_12_12_1$ | a=615.9, b=1030.5 c=1529.2 | $Ba_5Si_2N_6$ |
| $Ln_3Si_6N_{11}$ (Ln=La-Nd,Sm) | $P4bm$ | a=1018.9, c=483.7 (Ln=La) | $Ce_3Si_6N_{11}$ |
| $LnSi_3N_5$ (Ln=La-Nd) | $P2_12_12_1$ | a=785.3, b=1126.4 c=481.7 (Ln=La) | $LnSi_3N_5$ |
| $MYbSi_4N_7$ (M=Sr,Ba,Eu) | $P6_3mc$ | a=603.1, c=982.0 (M=Ba) | $MYbSi_4N_7$ |
| $MSiN_2$ (M=Be,Mg,Mn,Zn) | $Pna2_1$ | a=527.9, b=647.6 c=499.2 (M=Mg) | Wurtzit |
| $MSi_2N_3$ (M=Li,Na) | $Cmc2_1$ | a=922.2, b=529.6 c=478.0 (M=Li) | verz. Wurtzit, isotyp zu $Li_2SiO_3$ |
| $Ba_2Nd_7Si_{11}N_{23}$ | $Cmmm$ | a=1096.2, b=2304.6 c=964.9 | $Ba_2Nd_7Si_{11}N_{23}$ |
| $Er_{6.33}Si_{11}N_{21}$, $Dy_{0.3}Sm_6Si_{11}N_{21}$ | $P31c$ | a=989.8, c=1078.7 | $Er_{6.33}Si_{11}N_{21}$ |

*FIG. 5B*

ALUMINUM NITRIDE DOPANT SCHEME FOR BULK ACOUSTIC WAVE FILTERS

CROSS-REFERENCE TO RELATED APPLICATIONS

This application claims priority under 35 U.S.C. § 119(e) to U.S. Provisional Patent Application Ser. No. 62/983,152, titled ALUMINUM NITRIDE DOPANT SCHEME FOR BULK ACOUSTIC WAVE FILTERS, filed Feb. 28, 2020, which is incorporated herein by reference in tis entirety for all purposes.

BACKGROUND

Technical Field

Embodiments of this disclosure relate to piezoelectric materials that may be utilized as substrates in acoustic wave devices and to acoustic wave filters including such acoustic wave devices.

Description of Related Technology

Acoustic wave filters can filter radio frequency signals. An acoustic wave filter can include a plurality of resonators arranged to filter a radio frequency signal. The resonators can be arranged as a ladder circuit. Example acoustic wave filters include surface acoustic wave (SAW) filters, bulk acoustic wave (BAW) filters, and Lamb wave resonator filters. A film bulk acoustic resonator (FBAR) filter is an example of a BAW filter. A solidly mounted resonator (SMR) filter is another example of a BAW filter.

Acoustic wave filters can be implemented in radio frequency electronic systems. For instance, filters in a radio frequency front end of a mobile phone can include acoustic wave filters. Two acoustic wave filters can be arranged as a duplexer.

SUMMARY

In accordance with an aspect, there is provided an acoustic wave resonator comprising a piezoelectric material formed of aluminum nitride (AlN) doped with one or more of beryllium (Be), magnesium (Mg), zinc (Zn), calcium (Ca), strontium (Sr), lithium (Li), and sodium (Na) to enhance performance of the acoustic wave resonator.

In some embodiments, the one or more of Be, Mg, Zn, Ca, Sr, Li, and Na is charge balanced with at least one of Si and Ge and the material has a chemical formula of one of $Al_{1-2x}Ca_xSi_xN$ (0<x<1), $Al_{1-2x}Ca_xGe_xN$ (0<x<1), $Al_{1-2x}Sr_xSi_xN$ (0<x<1), $Al_{1-2x}Sr_xGe_xN$ (0<x<1), $Al_{1-2x}Be_xSi_xN$ (0<x<1), $Al_{1-2x}Be_xGe_xN$ (0<x<1), $Al_{1-2x}Mg_xSi_xN$ (0<x<1), $Al_{1-2x}Mg_xGe_xN$ (0<x<1), $Al_{1-2x}Zn_xSi_xN$ (0<x<1), $Al_{1-2x}Zn_xGe_xN$ (0<x<1), $Al_{1-3x}Li_xSi_{2x}N$ (0<x<1), $Al_{1-3x}Li_xGe_{2x}N$ (0<x<1), $Al_{1-3x}Na_xSi_{2x}N$ (0<x<1), or $Al_{1-3x}Na_xGe_{2x}N$ (0<x<1).

In some embodiments, the at least one of Si and Ge occupies Al sites within the crystal structure of the doped AlN.

In some embodiments, the AlN is doped with a compound exhibiting a Wurtzite or distorted Wurtzite crystal structure.

In some embodiments, the AlN is doped with $CaAlSiN_3$.

In some embodiments, the doped AlN has a chemical formula of $Al_{1-2x}Ca_xSi_xN$.

In accordance with another aspect, there is provided an acoustic wave filter including an acoustic wave resonator comprising a piezoelectric material formed of aluminum nitride (AlN) doped with one or more of beryllium (Be), magnesium (Mg), zinc (Zn), calcium (Ca), strontium (Sr), lithium (Li), and sodium (Na) to enhance performance of the acoustic wave resonator.

In some embodiments, the acoustic wave filter comprises a bulk acoustic wave (BAW) resonator including the doped AlN.

In some embodiments, the BAW resonator is one of a film bulk acoustic wave resonator, a Lamb wave resonator, or a surface mounted resonator.

In some embodiments, the acoustic wave filter comprises a radio frequency filter.

In some embodiments, an electronics module includes the acoustic wave filter.

In some embodiments, an electronic device includes the electronics module.

In accordance with another aspect, there is provided an acoustic wave resonator comprising a piezoelectric material formed of aluminum nitride (AlN) doped with one or more of beryllium (Be), strontium (Sr), and sodium (Na) to enhance performance of the acoustic wave resonator.

In some embodiments, the acoustic wave resonator is included in an acoustic wave filter.

In some embodiments, the acoustic wave filter comprises a bulk acoustic wave (BAW) resonator including the doped AlN.

In some embodiments, the BAW resonator is one of a film bulk acoustic wave resonator, a Lamb wave resonator, or a surface mounted resonator.

In some embodiments, the acoustic wave filter comprises a radio frequency filter.

In some embodiments, the acoustic wave filter is included in an electronics module.

In some embodiments, the electronics module is included in an electronic device.

In some embodiments, the one or more of Be, Sr, and Na is charge balanced with at least one of Si and Ge and the substrate material has a chemical formula of one of $Al_{1-2x}Sr_xSi_xN$ (0<x<1), $Al_{1-2x}Sr_xGe_xN$ (0<x<1), $Al_{1-2x}Be_xSi_xN$ (0<x<1), $Al_{1-2x}Be_xGe_xN$ (0<x<1), $Al_{1-3x}Na_xSi_{2x}N$ (0<x<1), or $Al_{1-3x}Na_xGe_{2x}N$ (0<x<1).

In some embodiments, the piezoelectric material has a Wurtzite crystal structure.

In accordance with another aspect, there is provided a method of forming an acoustic wave resonator. The method comprises depositing electrodes on a piezoelectric film formed of aluminum nitride (AlN) doped with one or more of beryllium (Be), strontium (Sr), and sodium (Na).

In some embodiments, depositing the electrodes on the piezoelectric film in includes depositing a first electrode on a top surface of the piezoelectric film and depositing a second electrode on a bottom surface of the piezoelectric film.

In some embodiments, the acoustic wave resonator is a film bulk acoustic wave resonator and the method further comprises defining a cavity below the lower surface of the piezoelectric film.

In some embodiments, the acoustic wave resonator is a Lamb wave resonator and depositing the first electrode on the top surface of the piezoelectric film comprises depositing interdigital transducer electrodes on the top surface of the piezoelectric film.

In some embodiments, the acoustic wave resonator is a solidly mounted resonator and the method further comprises forming the piezoelectric film on a top surface of a Bragg reflector.

In accordance with another aspect, there is provided a piezoelectric material comprising aluminum nitride (AlN) doped with one or more of beryllium (Be), strontium (Sr), and sodium (Na).

In some embodiments, the one or more of Be, Sr, and Na is charge balanced with at least one of Si and Ge and the piezoelectric material has a chemical formula of one of $Al_{1-2x}Sr_xSi_xN$ (0<x<1);

$Al_{1-2x}Sr_xGe_xN$ (0<x<1);

$Al_{1-2x}Be_xSi_xN$ (0<x<1);

$Al_{1-2x}Be_xGe_xN$ (0<x<1);

$Al_{1-3x}Na_xSi_{2x}N$ (0<x<1); or $Al_{1-3x}Na_xGe_{2x}N$ (0<x<1).

In some embodiments, the piezoelectric material has a Wurtzite crystal structure.

BRIEF DESCRIPTION OF THE DRAWINGS

Embodiments of this disclosure will now be described, by way of non-limiting example, with reference to the accompanying drawings.

FIG. 4 is a table of selected compounds which may be utilized to dope aluminum nitride to form a piezoelectric material for use in a bulk acoustic wave resonator;

FIGS. 5A and 5B are tables of a compounds that may be used as a piezoelectric material in a bulk acoustic wave resonator or which may be utilized to dope aluminum nitride to form a piezoelectric material for use in a bulk acoustic wave resonator;

DETAILED DESCRIPTION OF CERTAIN EMBODIMENTS

Figure 1:
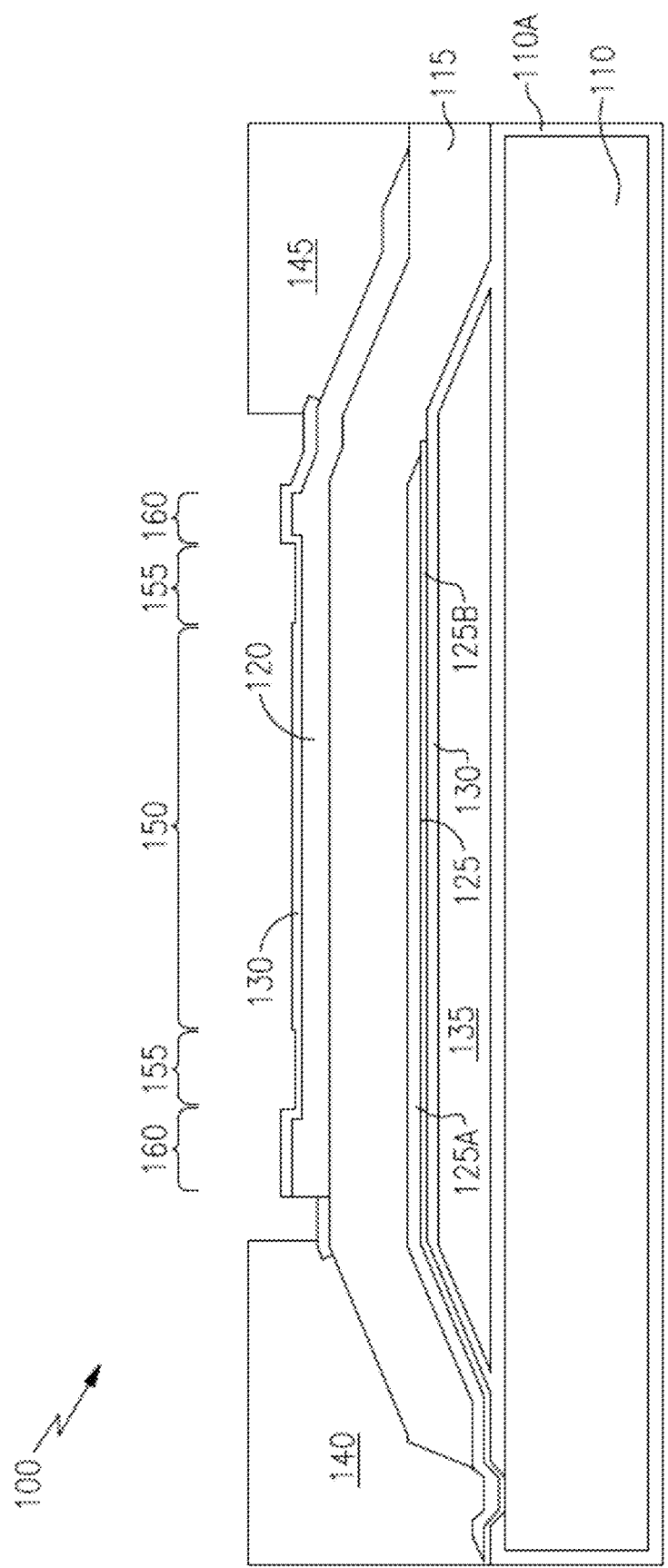
FIG. 1 is a cross-sectional view of an example of film bulk acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Film bulk acoustic wave resonators (FBARs) are a form of bulk acoustic wave resonator that generally includes a film of piezoelectric material sandwiched between a top and a bottom electrode and suspended over a cavity that allows for the film of piezoelectric material to vibrate. A signal applied across the top and bottom electrodes causes an acoustic wave to be generated in and travel through the film of piezoelectric material. A FBAR exhibits a frequency response to applied signals with a resonance peak determined by a thickness of the film of piezoelectric material. Ideally, the only acoustic wave that would be generated in a FBAR is a main acoustic wave that would travel through the film of piezoelectric material in a direction perpendicular to layers of conducting material forming the top and bottom electrodes. The piezoelectric material of a FBAR, however, typically has a non-zero Poisson's ratio. Compression and relaxation of the piezoelectric material associated with passage of the main acoustic wave may thus cause compression and relaxation of the piezoelectric material in a direction perpendicular to the direction of propagation of the main acoustic wave. The compression and relaxation of the piezoelectric material in the direction perpendicular to the direction of propagation of the main acoustic wave may generate transverse acoustic waves that travel perpendicular to the main acoustic wave (parallel to the surfaces of the electrode films) through the piezoelectric material. The transverse acoustic waves may be reflected back into an area in which the main acoustic wave propagates and may induce spurious acoustic waves travelling in the same direction as the main acoustic wave. These spurious acoustic waves may degrade the frequency response of the FBAR from what is expected or from what is intended and are generally considered undesirable.

FIG. 1 is cross-sectional view of an example of a FBAR, indicated generally at 100. The FBAR 100 is disposed on a substrate 110, for example, a silicon substrate that may include a dielectric surface layer 110A of, for example, silicon dioxide. The FBAR 100 includes a layer or film of piezoelectric material 115, for example, aluminum nitride (AlN). A top electrode 120 is disposed on top of a portion of the layer or film of piezoelectric material 115 and a bottom electrode 125 is disposed on the bottom of a portion of the layer or film of piezoelectric material 115. The top electrode 120 may be formed of, for example, ruthenium (Ru). The bottom electrode 125 may include a layer 125A of Ru disposed in contact with the bottom of the portion of the layer or film of piezoelectric material 115 and a layer 125B of titanium (Ti) disposed on a lower side of the layer 125A of Ru opposite a side of the layer 125A of Ru in contact with the bottom of the portion of the layer or film of piezoelectric material 115. Each of the top electrode 120 and the bottom electrode 125 may be covered with a layer of dielectric material 130, for example, silicon dioxide. A cavity 135 is defined beneath the layer of dielectric material 130 covering the bottom electrode 125 and the surface layer 110A of the substrate 110. A bottom electrical contact 140 formed of, for example, copper may make electrical connection with the bottom electrode 125 and a top electrical contact 145 formed of, for example, copper may make electrical connection with the top electrode 120.

The FBAR 100 may include a central region 150 including a main active domain in the layer or film of piezoelectric material 115 in which a main acoustic wave is excited during operation. The central region may have a width of, for example, between about 20 µm and about 100 µm. A recessed frame region or regions 155 may bound and define the lateral extent of the central region 150. The recessed frame regions may have a width of, for example, about 1 µm. The recessed frame region(s) 155 may be defined by areas that have a thinner layer of dielectric material 130 on top of the top electrode 120 than in the central region 150. The dielectric material layer 130 in the recessed frame region(s) 155 may be from about 10 nm to about 100 nm thinner than the dielectric material layer 130 in the central region 150. The difference in thickness of the dielectric material in the recessed frame region(s) 155 vs. in the central region 150 may cause the resonant frequency of the device in the recessed frame region(s) 155 to be between about 5 MHz to about 50 MHz higher than the resonant frequency of the device in the central region 150. In some embodiments, the thickness of the dielectric material layer 130 in the central region 150 may be about 200 nm to about 300 nm and the thickness of the dielectric material layer 130 in the recessed frame region(s) 155 may be about 100 nm. The dielectric film 300 in the recessed frame region(s) 155 is typically etched during manufacturing to achieve a desired difference in acoustic velocity between the central region 150 and the recessed frame region(s) 155. Accordingly, the dielectric film 300 initially deposited in both the central region 150 and recessed frame region(s) 155 is deposited with a sufficient thickness that allows for etching of sufficient dielectric film 300 in the recessed frame region(s) 155 to achieve a desired difference in thickness of the dielectric film 300 in the central region 150 and recessed frame region(s) 155 to achieve a desired acoustic velocity difference between these regions.

A raised frame region or regions 160 may be defined on an opposite side of the recessed frame region(s) 155 from the central region 150 and may directly abut the outside edge(s) of the recessed frame region(s) 155. The raised frame regions may have widths of, for example, about 1 µm. The raised frame region(s) 160 may be defined by areas where the top electrode 120 is thicker than in the central region 150 and in the recessed frame region(s) 155. The top electrode 120 may have the same thickness in the central region 150 and in the recessed frame region(s) 155 but a greater thickness in the raised frame region(s) 160. The top electrode 120 may be between about 50 nm and about 500 nm thicker in the raised frame region(s) 160 than in the central region 150 and/or in the recessed frame region(s) 155. In some embodiments the thickness of the top electrode in the central region may be between 50 and 500 nm.

The recessed frame region(s) 155 and the raised frame region(s) 160 may contribute to dissipation or scattering of transverse acoustic waves generated in the FBAR 100 during operation and/or may reflect transverse waves propagating outside of the recessed frame region(s) 155 and the raised frame region(s) 160 and prevent these transverse acoustic waves from entering the central region and inducing spurious signals in the main active domain region of the FBAR. Without being bound to a particular theory, it is believed that due to the thinner layer of dielectric material 130 on top of the top electrode 120 in the recessed frame region(s) 155, the recessed frame region(s) 155 may exhibit a higher velocity of propagation of acoustic waves than the central region 150. Conversely, due to the increased thickness and mass of the top electrode 120 in the raised frame region(s) 160, the raised frame regions 160 may exhibit a lower velocity of propagation of acoustic waves than the central region 150 and a lower velocity of propagation of acoustic waves than the recessed frame region(s) 155. The discontinuity in acoustic wave velocity between the recessed frame region(s) 155 and the raised frame region(s) 160 creates a barrier that scatters, suppresses, and/or reflects transverse acoustic waves.

Another form of BAW resonator is a Lamb wave acoustic wave resonator. A Lamb wave resonator can combine features of a surface acoustic wave (SAW) resonator and a BAW resonator. A Lamb wave resonator typically includes an interdigital transducer (IDT) electrode similar to a SAW resonator. Accordingly, the frequency of the Lamb wave resonator can be lithographically defined. A Lamb wave resonator can achieve a relatively high quality factor (Q) and a relatively high phase velocity like a BAW resonator (e.g., due to a suspended structure). A Lamb wave resonator that includes an AlN piezoelectric layer can be relatively easy to integrate with other circuits, for example, because AlN process technology can be compatible with complementary metal oxide semiconductor (CMOS) process technology. AlN Lamb wave resonators can overcome a relatively low resonance frequency limitation and integration challenge associated with SAW resonators and also overcome multiple frequency capability challenges associated with BAW resonators. Some Lamb wave resonator topologies are based on acoustic reflection from periodic reflective gratings. Some other Lamb wave resonator topologies are based on acoustic reflection from suspended free edges of a piezoelectric layer.

Figure 2:
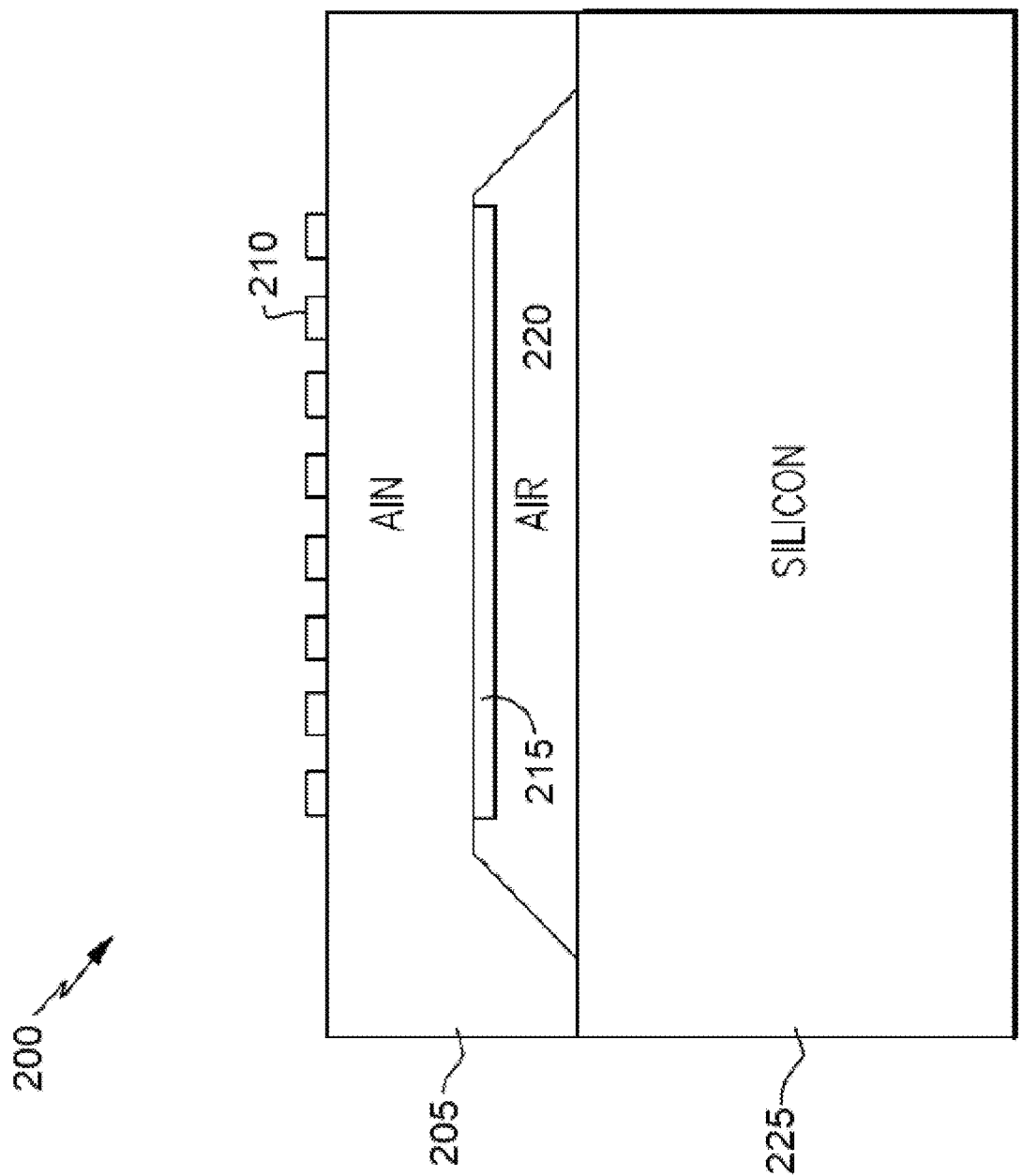
FIG. 2 is a cross-sectional view of an example of Lamb wave resonator.

An example of a Lamb wave acoustic wave resonator is indicated generally at 200 in FIG. 2. The Lamb wave resonator 200 includes features of a SAW resonator and an FBAR. As illustrated, the Lamb wave resonator 200 includes a piezoelectric layer 205, an interdigital transducer electrode (IDT) 210 on the piezoelectric layer 205, and a lower electrode 215 disposed on a lower surface of the piezoelectric layer 205. The piezoelectric layer 205 can be a thin film. The piezoelectric layer 205 can be an aluminum nitride layer. In other instances, the piezoelectric layer 205 can be any suitable piezoelectric layer. The resonant frequency of the Lamb wave resonator can be based on the geometry of the IDT 210. The electrode 215 can be grounded in certain instances. In some other instances, the electrode 215 can be floating. An air cavity 220 is disposed between the electrode 215 and a semiconductor substrate 225. Any suitable cavity can be implemented in place of the air cavity 220, for example, a vacuum cavity or a cavity filled with a different gas.

Figure 3:
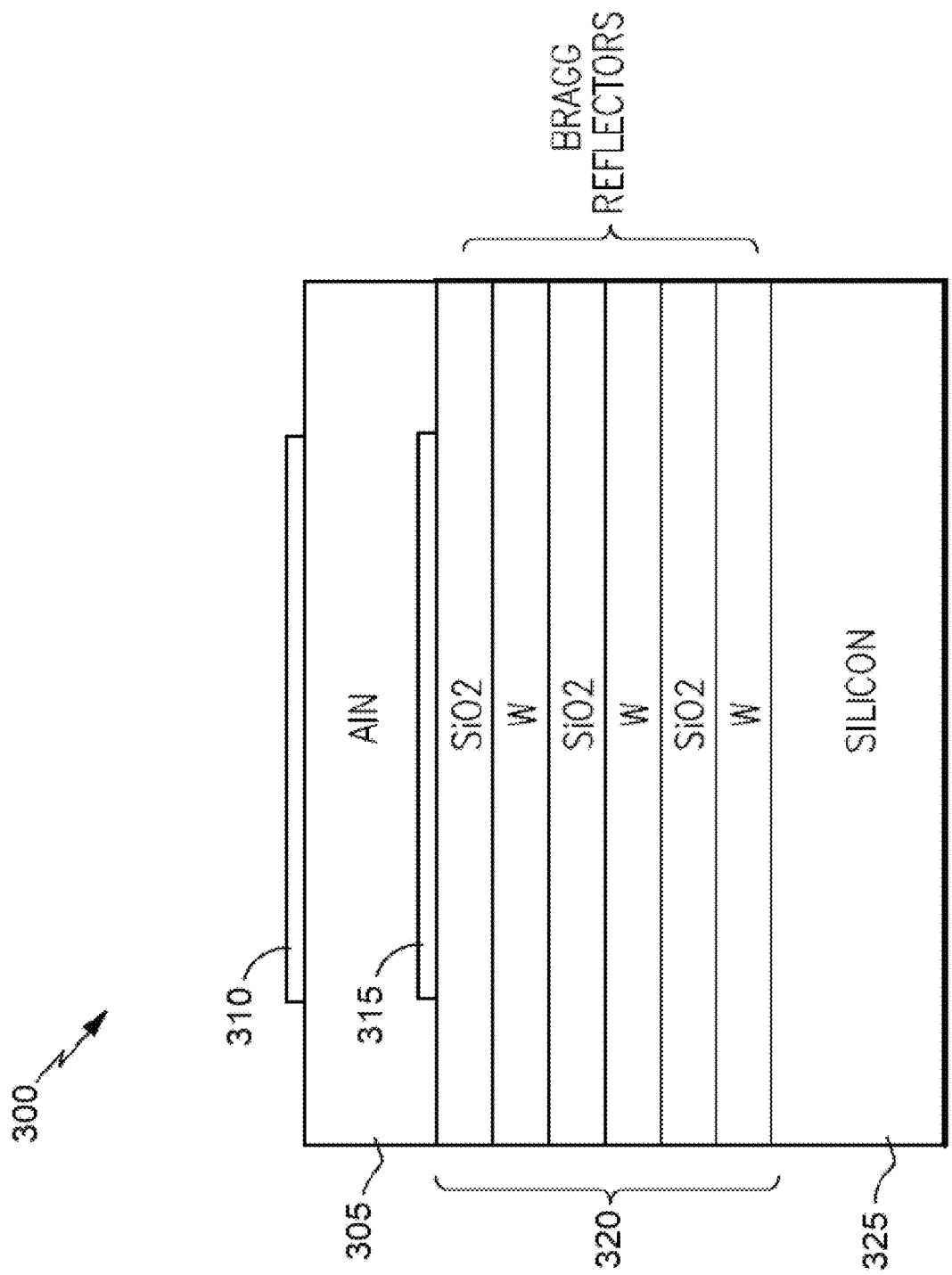
FIG. 3 is a cross-sectional view of an example of a surface mounted resonator.

Another form of BAW resonator is a surface mounted resonator (SMR). An example of an SMR is illustrated generally at 300 in FIG. 3. As illustrated, the SMR 300 includes a piezoelectric layer 305, an upper electrode 310 on the piezoelectric layer 305, and a lower electrode 315 on a lower surface of the piezoelectric layer 305. The piezoelectric layer 305 can be an aluminum nitride layer. In other instances, the piezoelectric layer 305 can be any other suitable piezoelectric layer. The lower electrode 315 can be grounded in certain instances. In some other instances, the lower electrode 315 can be floating. Bragg reflectors 320 are disposed between the lower electrode 315 and a semiconductor substrate 325. The semiconductor substrate 325 can be a silicon substrate. Any suitable Bragg reflectors can be implemented. For example, the Bragg reflectors can be $SiO_2$/W.

In the BAW resonators discussed above, the respective piezoelectric layers may be formed of AlN. It has been discovered that the operating characteristics, for example, coupling factor and/or quality factor of BAW resonators as disclosed herein may be improved by adding one or more dopant elements to the AlN forming the respective piezoelectric layers. FIG. 4 includes a table of various compounds (the "End member" column) that may be used to dope AlN and the resultant chemical formula (the "Solid Solution Series" column) for the doped material that may be utilized as a piezoelectric material in BAW resonators. FIGS. 5A and 5B are tables of additional Wurtzite related nitride compounds that may be used as dopants for AlN to form piezoelectric materials for use in BAW resonators, or that may themselves be used as piezoelectric materials in BAW resonators. The tables of FIGS. 5A and 5B were obtained from Ottinger, Doctoral Thesis (2004) Diss. ETH Nr. 15624.

Aluminum nitride doped with scandium nitride (ScN) used as a piezoelectric material in BAW resonators has been found to improve operating characteristics of the BAW resonators as compared to similar BAW resonators utilizing undoped AlN for their piezoelectric layers. Without being bound to a particular theory, it is believed that the electropositive characteristic of Sc may contribute to the improved operating characteristics of BAW resonators utilizing AlN doped with Sc for their piezoelectric layers. Accordingly, doping AlN with elements even more electropositive than Sc may result in piezoelectric materials superior to Sc-doped AlN for use in BAW resonators. Charge compensating for dopants in AlN with silica instead of alternate elements such as zirconia may provide a better fit into the tetrahedral sites of the AlN crystal structure wherein Si may substitute for Al, which may provide for a piezoelectric material exhibiting a higher quality factor in a BAW resonator relative to AlN doped with Sc or co-doped with Mg/Zr. Dopant compounds ("end members") having a Wurtzite or distorted Wurtzite structure may exhibit a wider range of dopant concentrations that maintain a solid solution in AlN than that attainable with halite structured ScN.

Figure 6A:
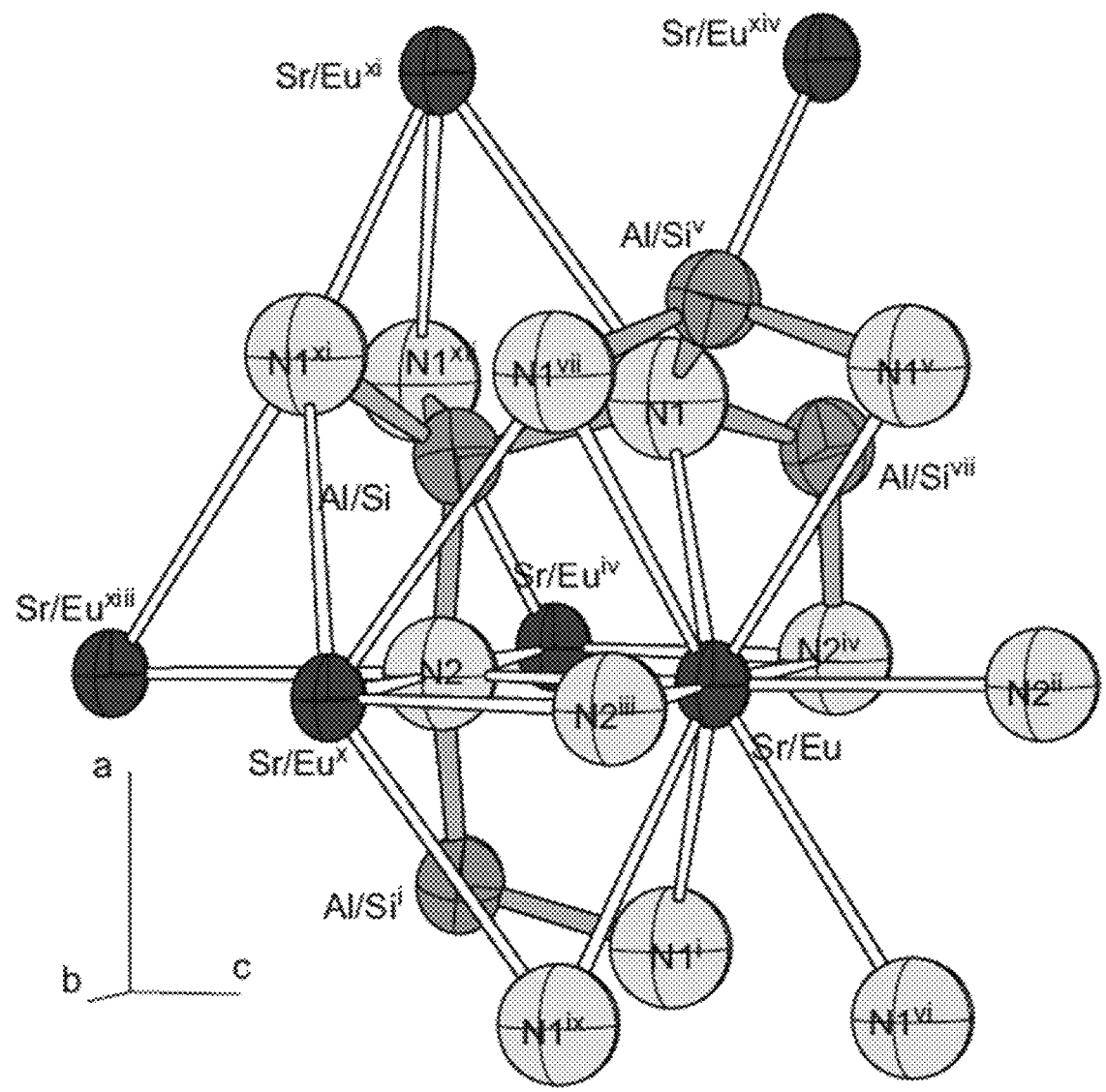
FIGS. 6A-6D illustrate the crystal structure of a material that may be used as a piezoelectric material in a bulk acoustic wave resonator.
Figure 6B:
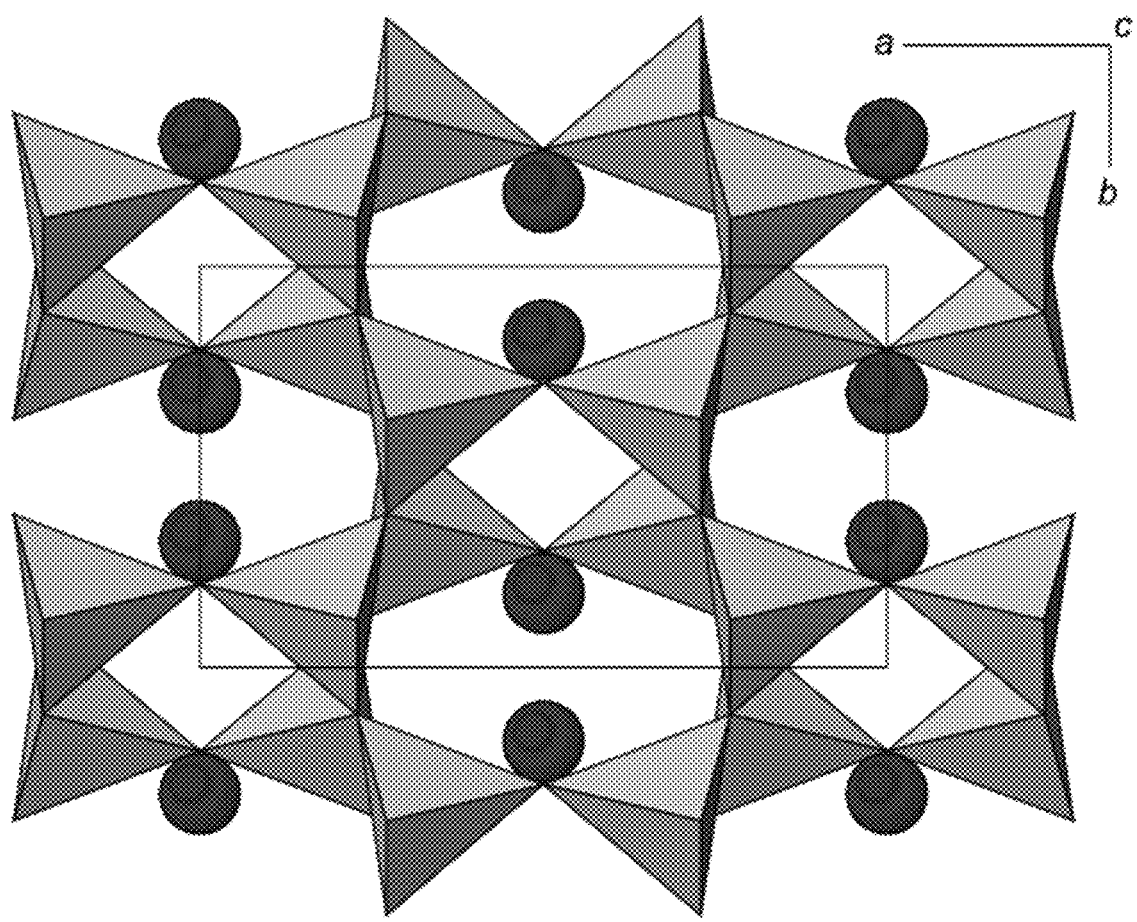
Figure 6C:
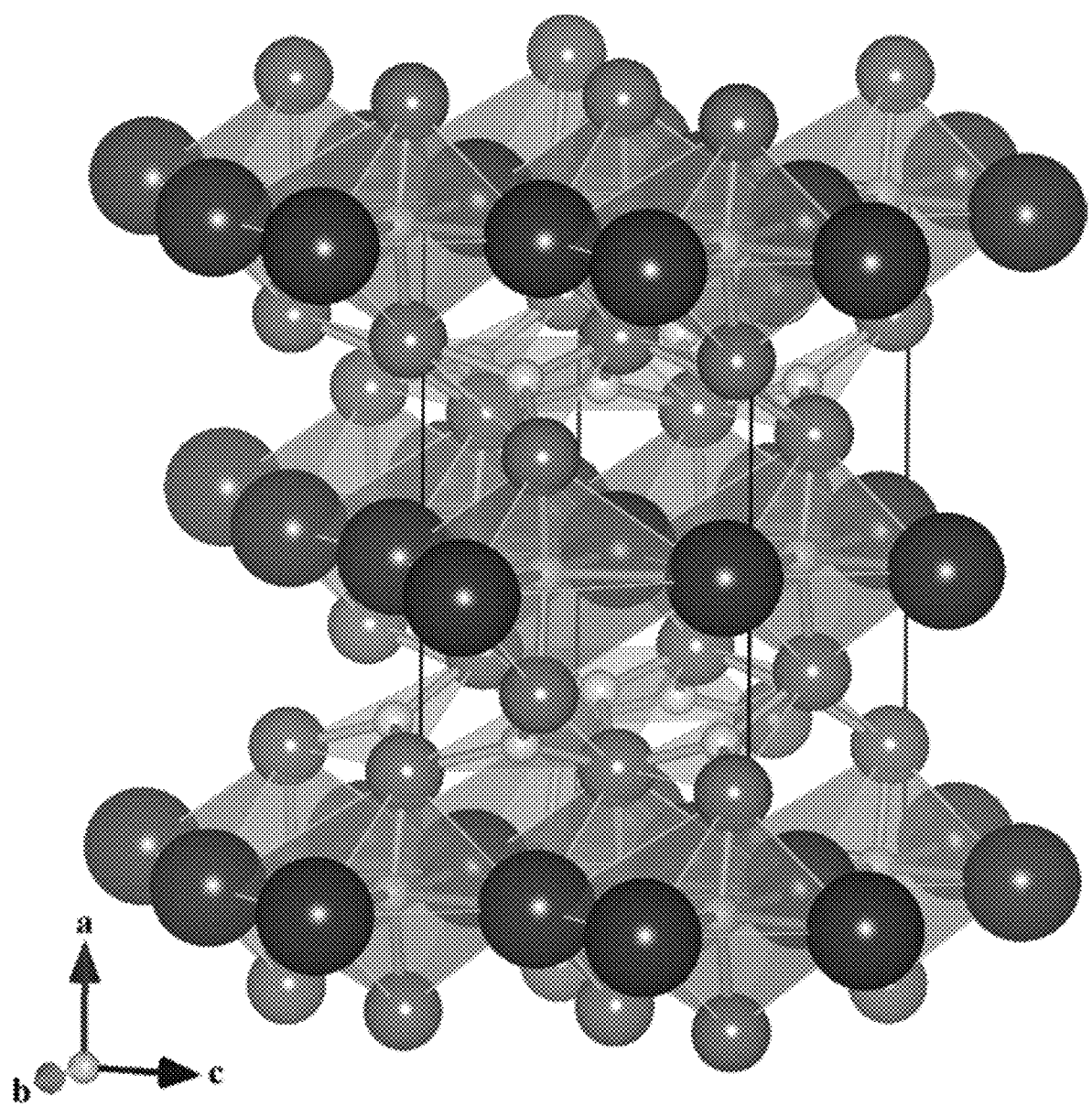
Figure 6D:
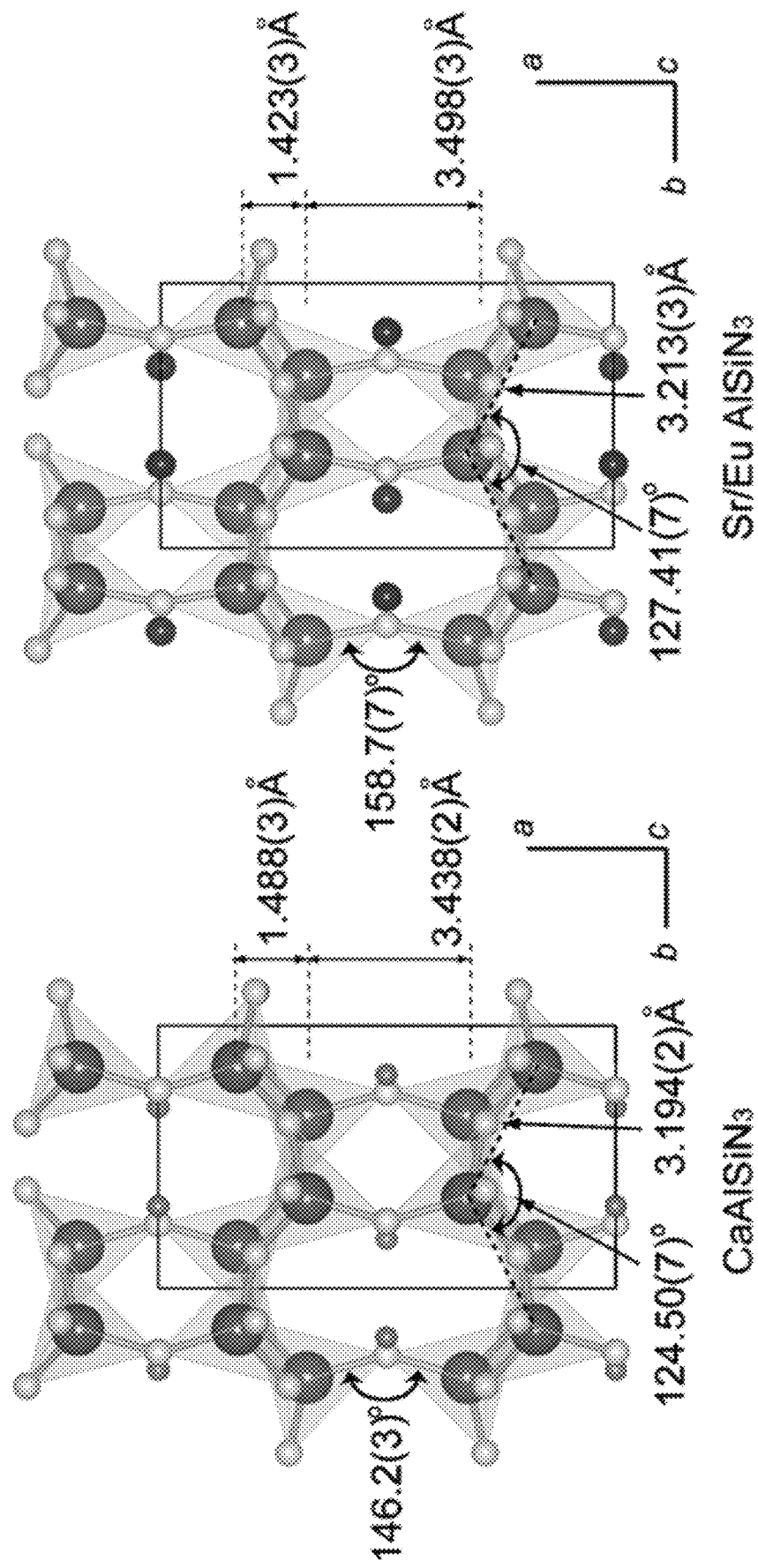

The crystal structures of selected materials that may be advantageously used for piezoelectric materials in BAW resonators are illustrated in FIGS. 6A-6D. FIG. 6A illustrates the crystal structure of $Sr_{0.99}Eu_{0.01}AlSiN_3$. FIG. 6B is a projective representation of the crystal structure of $Sr_{0.99}Eu_{0.01}AlSiN_3$ illustrated with Al/Si-centered nitrogen tetrahedra. FIG. 6C is a crystal structure representation of $Sr_{0.99}Eu_{0.01}AlSiN_3$ in a $N_2$-centered Sr/Eu—Al/Si octahedra. FIG. 6D is a comparison of the crystal structures of $CaAlSiN_3$ and $Sr_{0.99}Eu_{0.01}AlSiN_3$ projected on the a-b plane. FIGS. 6A-6D were obtained from Watanabe et. al., J. Solid State Chem. 181, 1848 (2008).

It should be appreciated that the BAW resonators illustrated in the figures are illustrated in a highly simplified form. The relative dimensions of the different features are not shown to scale. Further, typical BAW resonators may include additional features or layers not illustrated.

Figure 7:
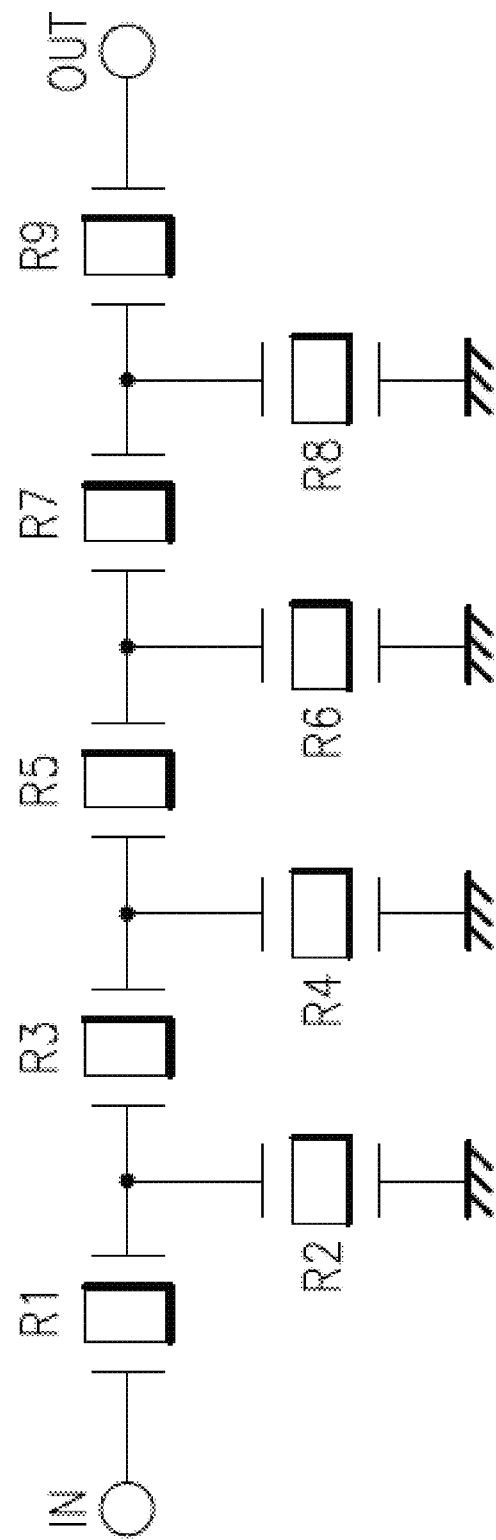
FIG. 7 illustrates an example of a radio frequency filter.

In some embodiments, multiple BAW resonators as disclosed herein may be combined into a filter, for example, an RF ladder filter schematically illustrated in FIG. 7 and including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include BAW devices or resonators, for example, duplexers, baluns, etc., may also be formed including examples of BAW resonators as disclosed herein.

Figure 8:
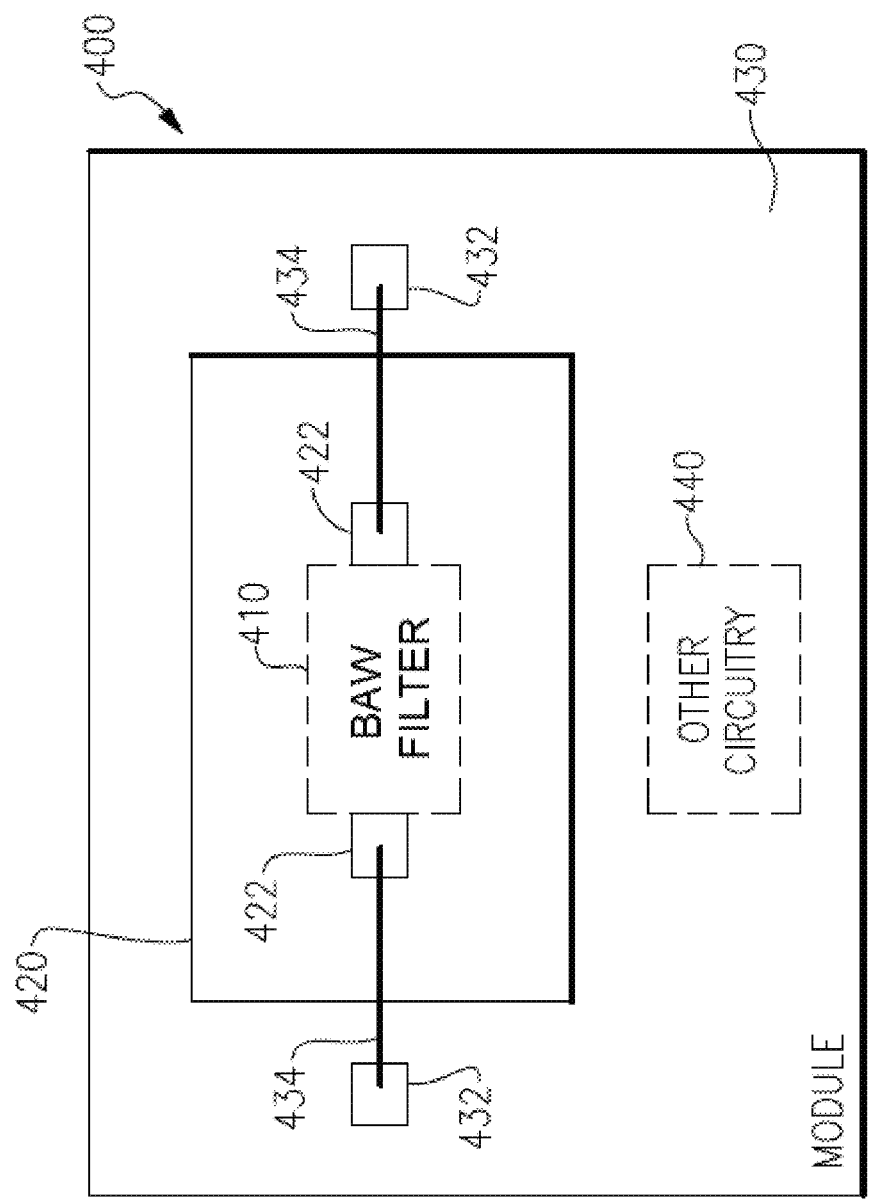
FIG. 8 illustrates an embodiment of an electronics module.
Figure 9:
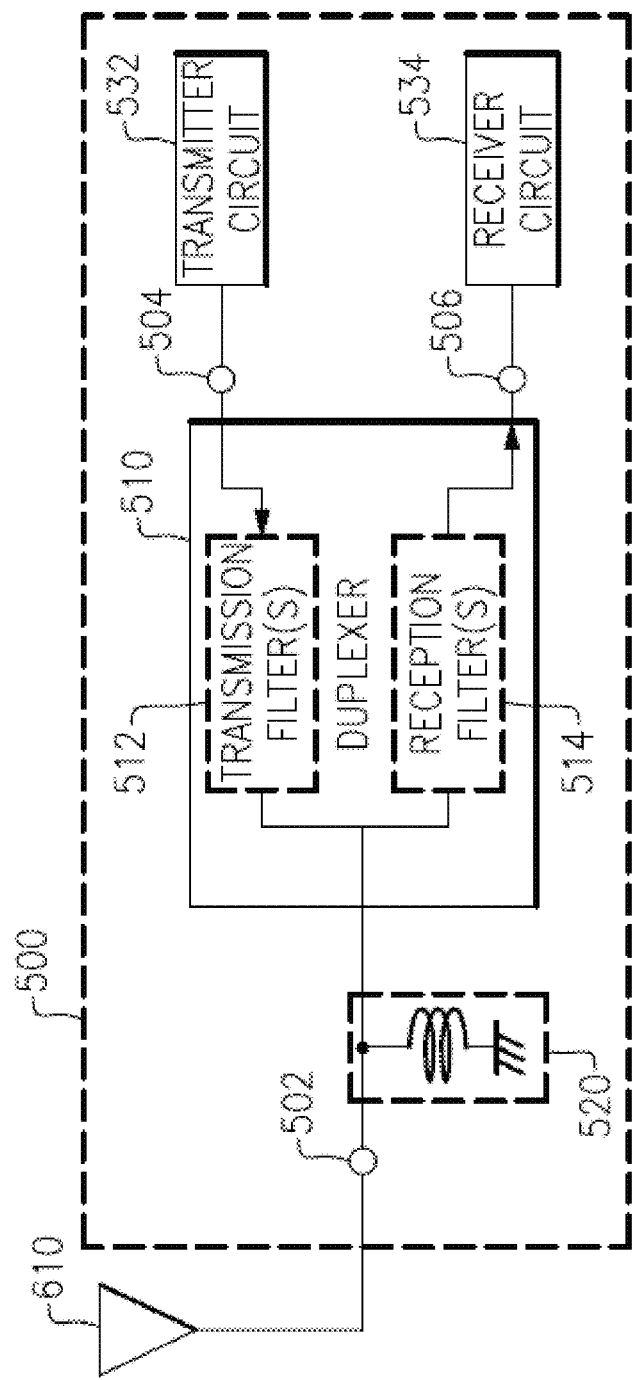
FIG. 9 illustrates an example of a front-end module which may be used in an electronic device.
Figure 10:
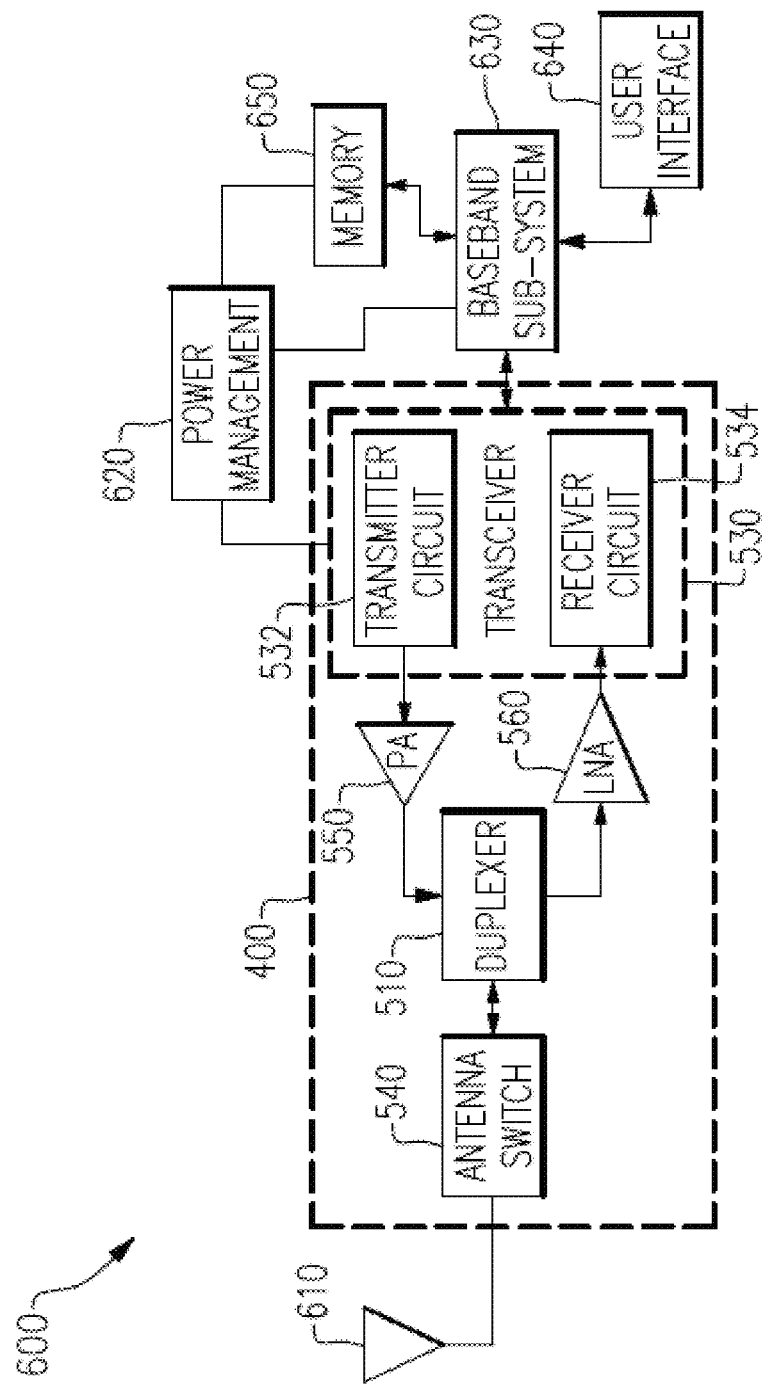
FIG. 10 illustrates an example of an electronic device.

The acoustic wave devices discussed herein can be implemented in a variety of packaged modules. Some example packaged modules will now be discussed in which any suitable principles and advantages of the packaged acoustic wave devices discussed herein can be implemented. FIGS. 8, 9, and 10 are schematic block diagrams of illustrative packaged modules and devices according to certain embodiments.

As discussed above, embodiments of the disclosed BAW resonators can be configured as or used in filters, for example. In turn, a BAW filter using one or more BAW elements may be incorporated into and packaged as a module that may ultimately be used in an electronic device, such as a wireless communications device, for example. FIG. 8 is a block diagram illustrating one example of a module 400 including a BAW filter 410. The BAW filter 410 may be implemented on one or more die(s) 420 including one or more connection pads 422. For example, the BAW filter 410 may include a connection pad 422 that corresponds to an input contact for the BAW filter and another connection pad 422 that corresponds to an output contact for the BAW filter. The packaged module 400 includes a packaging substrate 430 that is configured to receive a plurality of components, including the die 420. A plurality of connection pads 432 can be disposed on the packaging substrate 430, and the various connection pads 422 of the BAW filter die 420 can be connected to the connection pads 432 on the packaging substrate 430 via electrical connectors 434, which can be solder bumps or wirebonds, for example, to allow for passing of various signals to and from the BAW filter 410. The module 400 may optionally further include other circuitry die 440, such as, for example, one or more additional filter(s), amplifiers, pre-filters, modulators, demodulators, down converters, and the like, as would be known to one of skill in the art of semiconductor fabrication in view of the disclosure herein. In some embodiments, the module 400 can also include one or more packaging structures to, for example, provide protection and facilitate easier handling of the module 400. Such a packaging structure can include an overmold formed over the packaging substrate 430 and dimensioned to substantially encapsulate the various circuits and components thereon.

Various examples and embodiments of the BAW filter 410 can be used in a wide variety of electronic devices. For example, the BAW filter 410 can be used in an antenna duplexer, which itself can be incorporated into a variety of electronic devices, such as RF front-end modules and communication devices.

Referring to FIG. 9, there is illustrated a block diagram of one example of a front-end module 500, which may be used in an electronic device such as a wireless communications device (e.g., a mobile phone) for example. The front-end module 500 includes an antenna duplexer 510 having a common node 502, an input node 504, and an output node 506. An antenna 610 is connected to the common node 502.

The antenna duplexer 510 may include one or more transmission filters 512 connected between the input node 504 and the common node 502, and one or more reception filters 514 connected between the common node 502 and the output node 506. The passband(s) of the transmission filter(s) are different from the passband(s) of the reception filter(s). Examples of the BAW filter 410 can be used to form the transmission filter(s) 512 and/or the reception filter(s) 514. An inductor or other matching component 520 may be connected at the common node 502.

The front-end module 500 further includes a transmitter circuit 532 connected to the input node 504 of the duplexer 510 and a receiver circuit 534 connected to the output node 506 of the duplexer 510. The transmitter circuit 532 can generate signals for transmission via the antenna 610, and the receiver circuit 534 can receive and process signals received via the antenna 610. In some embodiments, the receiver and transmitter circuits are implemented as separate components, as shown in FIG. 9, however in other embodiments these components may be integrated into a common transceiver circuit or module. As will be appreciated by those skilled in the art, the front-end module 500 may include other components that are not illustrated in FIG. 9 including, but not limited to, switches, electromagnetic couplers, amplifiers, processors, and the like.

FIG. 10 is a block diagram of one example of a wireless device 600 including the antenna duplexer 510 shown in FIG. 9. The wireless device 600 can be a cellular phone, smart phone, tablet, modem, communication network or any other portable or non-portable device configured for voice or data communication. The wireless device 600 can receive and transmit signals from the antenna 610. The wireless device includes an embodiment of a front-end module 500 similar to that discussed above with reference to FIG. 9. The front-end module 500 includes the duplexer 510, as discussed above. In the example shown in FIG. 10 the front-end module 500 further includes an antenna switch 540, which can be configured to switch between different frequency bands or modes, such as transmit and receive modes, for example. In the example illustrated in FIG. 10, the antenna switch 540 is positioned between the duplexer 510 and the antenna 610; however, in other examples the duplexer 510 can be positioned between the antenna switch 540 and the antenna 610. In other examples the antenna switch 540 and the duplexer 510 can be integrated into a single component.

The front-end module 500 includes a transceiver 530 that is configured to generate signals for transmission or to process received signals. The transceiver 530 can include the transmitter circuit 532, which can be connected to the input node 504 of the duplexer 510, and the receiver circuit 534, which can be connected to the output node 506 of the duplexer 510, as shown in the example of FIG. 9.

Signals generated for transmission by the transmitter circuit 532 are received by a power amplifier (PA) module 550, which amplifies the generated signals from the transceiver 530. The power amplifier module 550 can include one or more power amplifiers. The power amplifier module 550 can be used to amplify a wide variety of RF or other frequency-band transmission signals. For example, the power amplifier module 550 can receive an enable signal that can be used to pulse the output of the power amplifier to aid in transmitting a wireless local area network (WLAN) signal or any other suitable pulsed signal. The power amplifier module 550 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 550 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 10, the front-end module 500 may further include a low noise amplifier module 560, which amplifies received signals from the antenna 610 and provides the amplified signals to the receiver circuit 534 of the transceiver 530.

The wireless device 600 of FIG. 10 further includes a power management sub-system 620 that is connected to the transceiver 530 and manages the power for the operation of the wireless device 600. The power management system 620 can also control the operation of a baseband sub-system 630 and various other components of the wireless device 600. The power management system 620 can include, or can be connected to, a battery (not shown) that supplies power for the various components of the wireless device 600. The power management system 620 can further include one or more processors or controllers that can control the transmission of signals, for example. In one embodiment, the baseband sub-system 630 is connected to a user interface 640 to facilitate various input and output of voice and/or data provided to and received from the user. The baseband sub-system 630 can also be connected to memory 650 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

EXAMPLE

Figure 11:
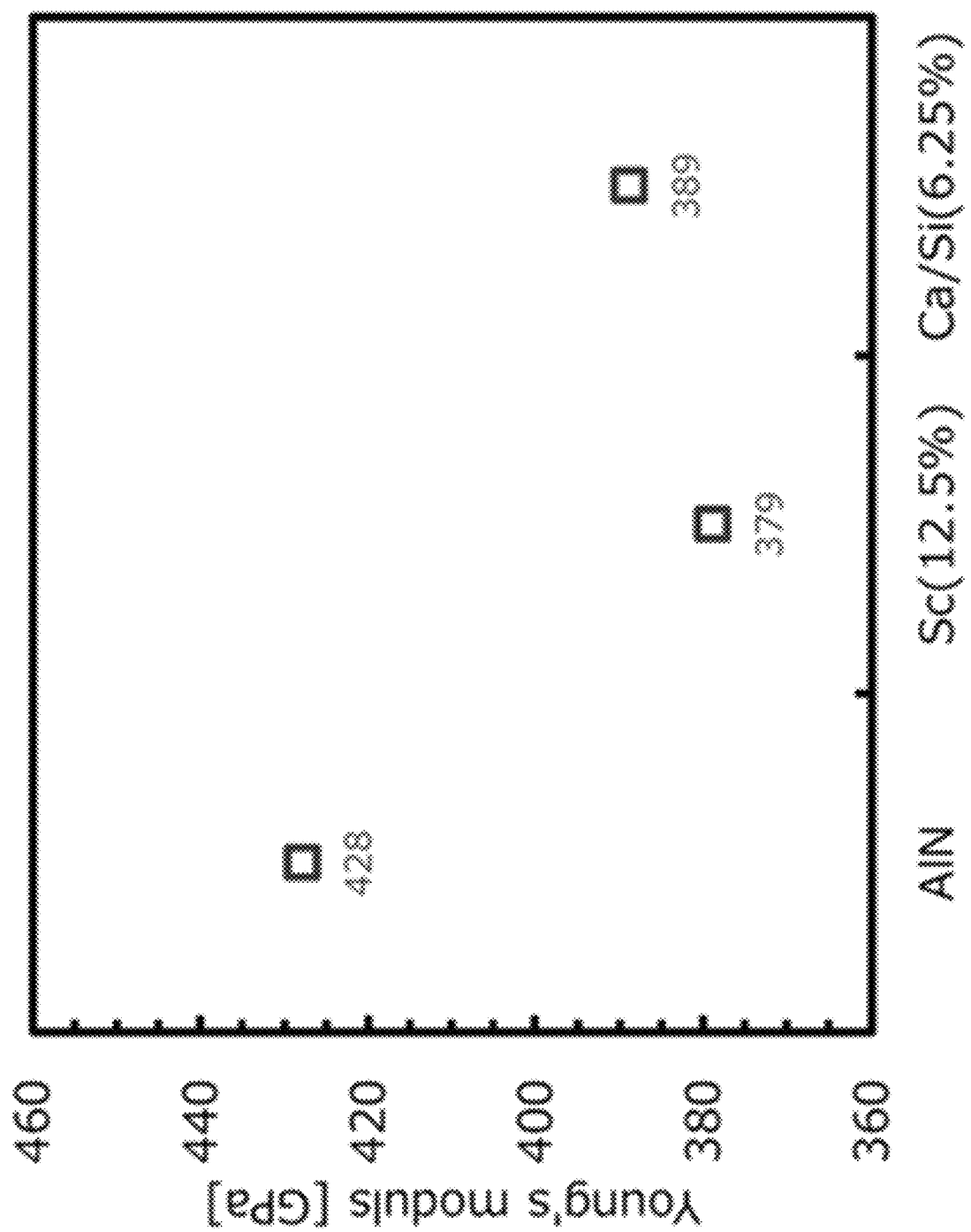
FIG. 11 illustrates results of simulation of the Young's modulus of Al doped with Ca and Si as compared to the Young's modulii of AlN and AlN doped with Sc.

Simulations were performed to determine the expected Young's modulus of the material having the formula $Al_{0.875}Ca_{0.0625}Si_{0.0625}N$ to that of the material having the formula $Al_{0.875}Sc_{0.125}N$ and to undoped AlN. The results of this simulation are illustrated in FIG. 11. As illustrated the $Al_{0.875}Ca_{0.0625}Si_{0.0625}N$ material is expected to have a Young's modulus less than that of undoped AlN, but above that of $Al_{0.875}Sc_{0.125}N$.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An acoustic wave resonator comprising a piezoelectric material formed of aluminum nitride (AlN) doped with one or more of beryllium (Be), strontium (Sr), and sodium (Na) to enhance performance of the acoustic wave resonator, the one or more of Be, Sr, and Na being charge balanced with at least one of Si and Ge, the piezoelectric material having a chemical formula of one of:

$Al_{1-2x}Sr_xSi_xN$ (0<$x$<1);

$Al_{1-2x}Sr_xGe_xN$ (0<$x$<1);

$Al_{1-2x}Be_xSi_xN$ (0<$x$<1);

$Al_{1-2x}Be_xGe_xN$ (0<$x$<1);

$Al_{1-3x}Na_xSi_{2x}N$ (0<$x$<1); or $Al_{1-3x}Na_xGe_{2x}N$ (0<$x$<1).

2. An acoustic wave filter including the acoustic wave resonator of claim 1.

3. The acoustic wave filter of claim 2 comprising a bulk acoustic wave (BAW) resonator including the doped AlN.

4. The acoustic wave filter of claim 3 wherein the BAW resonator is one of a film bulk acoustic wave resonator, a Lamb wave resonator, or a solidly mounted resonator.

5. The acoustic wave filter of claim 3 comprising a radio frequency filter.

6. An electronics module including the radio frequency filter of claim 5.

7. An electronic device including the electronics module of claim 6.

8. The acoustic wave resonator of claim 1 wherein the piezoelectric material has a Wurtzite crystal structure.

9. A method of forming an acoustic wave resonator comprising depositing electrodes on a piezoelectric film formed of aluminum nitride (AlN) doped with one or more of beryllium (Be), strontium (Sr), and sodium (Na), the one or more of Be, Sr, and Na being charge balanced with at least one of Si and Ge, the material of the piezoelectric film having a chemical formula of one of:

$Al_{1-2x}Sr_xSi_xN$ (0<$x$<1);

$Al_{1-2x}Sr_xGe_xN$ (0<$x$<1);

$Al_{1-2x}Be_xSi_xN$ (0<$x$<1);

$Al_{1-2x}Be_xGe_xN$ (0<$x$<1);

$Al_{1-3x}Na_xSi_{2x}N$ (0<$x$<1); or $Al_{1-3x}Na_xGe_{2x}N$ (0<$x$<1).

10. The method of claim 9 wherein depositing the electrodes on the piezoelectric film includes depositing a first electrode on a top surface of the piezoelectric film and depositing a second electrode on a bottom surface of the piezoelectric film.

11. The method of claim 10 wherein the acoustic wave resonator is a film bulk acoustic wave resonator and the method further comprises defining a cavity below the bottom surface of the piezoelectric film.

12. The method of claim 10 wherein the acoustic wave resonator is a Lamb wave resonator and depositing the first electrode on the top surface of the piezoelectric film comprises depositing interdigital transducer electrodes on the top surface of the piezoelectric film.

13. The method of claim 10 wherein the acoustic wave resonator is a solidly mounted resonator and the method further comprises forming the piezoelectric film on a top surface of a Bragg reflector.

14. A piezoelectric material comprising aluminum nitride (AlN) doped with one or more of beryllium (Be), strontium (Sr), and sodium (Na), the one or more of Be, Sr, and Na being charge balanced with at least one of Si and Ge, the piezoelectric material having a chemical formula of one of:

$Al_{1-2x}Sr_xSi_xN$ (0<$x$<1);

$Al_{1-2x}Sr_xGe_xN$ (0<$x$<1);

$Al_{1-2x}Be_xSi_xN$ (0<$x$<1);

$Al_{1-2x}Be_xGe_xN$ (0<$x$<1);

$Al_{1-3x}Na_xSi_{2x}N$ (0<$x$<1); or $Al_{1-3x}Na_xGe_{2x}N$ (0<$x$<1).

15. The piezoelectric material of claim 14 having a Wurtzite crystal structure.

* * * * *